United States Patent
Toms et al.

(10) Patent No.: US 9,014,749 B2
(45) Date of Patent: Apr. 21, 2015

(54) SYSTEM AND METHOD TO INITIATE A HOUSEKEEPING OPERATION AT A MOBILE DEVICE

(75) Inventors: Thomas R. Toms, Dripping Springs, TX (US); Hari M. Rao, San Diego, CA (US); Seung H. Kang, San Diego, CA (US); Jung Pill Kim, San Diego, CA (US); Jungwon Suh, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 753 days.

(21) Appl. No.: 12/855,045

(22) Filed: Aug. 12, 2010

(65) Prior Publication Data

US 2012/0040712 A1   Feb. 16, 2012

(51) Int. Cl.
*H04M 1/00* (2006.01)
*G11C 16/34* (2006.01)
*G06F 11/10* (2006.01)
*G06F 1/26* (2006.01)

(52) U.S. Cl.
CPC ........ *G11C 16/3418* (2013.01); *G06F 11/1048* (2013.01); *G06F 1/263* (2013.01)

(58) Field of Classification Search
CPC ............... H04M 1/72519; H04M 2203/402; H04M 11/00; H04M 1/00; H04M 10/48; H04M 10/5004; H04M 10/5006; H04M 41/00; G11C 5/141; G11C 11/406; G11C 11/005; G11C 11/40615; G11C 11/4072; G11C 11/40611; G11C 11/40626; G11C 7/1006; G11C 29/783; G11C 29/83; G06F 1/3203; G06F 1/3206; G06F 11/1469; G06F 12/0238; G06F 13/00; H01L 22/22; H01M 2010/4278; H03M 13/09; H01G 5/16; H01G 7/00; H01G 9/14
USPC ............... 455/550.1, 572, 573, 574; 320/114, 320/115, 133, 134, 136, 155
See application file for complete search history.

(56) References Cited

U.S. PATENT DOCUMENTS

| | | | |
|---|---|---|---|
| 5,572,110 A | 11/1996 | Dunstan | |
| 6,018,477 A | 1/2000 | Wang | |
| 6,249,690 B1 | 6/2001 | Mashiko | |
| 6,529,744 B1 * | 3/2003 | Birkler et al. | 455/557 |
| 7,177,222 B2 | 2/2007 | Spengler | |
| 7,200,711 B2 | 4/2007 | Valin et al. | |
| 7,567,464 B2 | 7/2009 | Gendrier et al. | |
| 7,609,576 B2 | 10/2009 | Watanabe et al. | |
| 2002/0039916 A1 | 4/2002 | Hosoi | |
| 2002/0090971 A1 | 7/2002 | Suzuki | |

(Continued)

FOREIGN PATENT DOCUMENTS

| | | |
|---|---|---|
| EP | 1622341 A2 | 2/2006 |
| JP | 2000207890 A | 7/2000 |

(Continued)

OTHER PUBLICATIONS

International Search Report and Written Opinion—PCT/US2011/047535—ISAEPO—Feb. 13, 2012.

*Primary Examiner* — Nimesh Patel
(74) *Attorney, Agent, or Firm* — Donald D. Min

(57) ABSTRACT

A system and method to initiate a housekeeping operation at a mobile device is disclosed. In a particular embodiment, a method at a mobile device includes modifying a scheduled housekeeping operation in response to determining that the mobile device is in a charging mode.

30 Claims, 10 Drawing Sheets

(56) References Cited

U.S. PATENT DOCUMENTS

| | | |
|---|---|---|
| 2002/0155865 A1 | 10/2002 | Aoyama |
| 2003/0098670 A1* | 5/2003 | Kobayashi ............ 320/114 |
| 2005/0156712 A1* | 7/2005 | Jyrinki ............ 340/286.01 |
| 2005/0239497 A1* | 10/2005 | Bahl et al. ............ 455/552.1 |
| 2005/0253554 A1 | 11/2005 | DiFazio et al. |
| 2006/0026653 A1 | 2/2006 | Matsunami |
| 2006/0158154 A1* | 7/2006 | Maurilus ............ 320/115 |
| 2007/0174579 A1 | 7/2007 | Shin |
| 2008/0222483 A1 | 9/2008 | Ito et al. |
| 2009/0154274 A1 | 6/2009 | Abu-Rahma et al. |
| 2009/0170569 A1 | 7/2009 | Anzai et al. |
| 2009/0183053 A1 | 7/2009 | Ito et al. |
| 2009/0191925 A1* | 7/2009 | Moseler et al. ............ 455/573 |
| 2009/0312046 A1 | 12/2009 | Clevenger et al. |
| 2010/0161883 A1 | 6/2010 | Kurashige |

FOREIGN PATENT DOCUMENTS

| | | |
|---|---|---|
| JP | 2002157170 A | 5/2002 |
| JP | 2003109293 A | 4/2003 |
| JP | 2005189969 A | 7/2005 |
| JP | 2006126975 A | 5/2006 |
| JP | 2007148684 A | 6/2007 |
| JP | 2007193803 A | 8/2007 |
| JP | 2007329623 A | 12/2007 |
| JP | 2009054016 A | 3/2009 |
| JP | 2009070325 A | 4/2009 |
| JP | 2009164945 A | 7/2009 |
| JP | 2009180848 A | 8/2009 |
| JP | 2010152551 A | 7/2010 |
| KR | 100725410 B1 | 5/2007 |
| WO | WO-2009032928 A2 | 3/2009 |

\* cited by examiner

SYSTEM AND METHOD TO INITIATE A HOUSEKEEPING OPERATION AT A MOBILE DEVICE

I. FIELD

The present disclosure is generally related to initiating a housekeeping operation at a mobile device.

II. DESCRIPTION OF RELATED ART

Advances in technology have resulted in smaller and more powerful computing devices. For example, there currently exist a variety of portable personal computing devices, including wireless computing devices, such as portable wireless telephones, personal digital assistants (PDAs), and paging devices that are small, lightweight, and easily carried by users. More specifically, portable wireless telephones, such as cellular telephones and internet protocol (IP) telephones, can communicate voice and data packets over wireless networks. Further, many such wireless telephones include other types of devices that are incorporated therein. For example, a wireless telephone can also include a digital still camera, a digital video camera, a digital recorder, and an audio file player. Also, such wireless telephones can process executable instructions, including software applications, such as a web browser application, that can be used to access the Internet. As such, these wireless telephones can include significant computing and data storage capabilities.

The reliability of the computing and data storage capabilities of a mobile device depends in part upon the performance of housekeeping operations at the mobile device. For example, a memory of the mobile device may periodically perform an error correction housekeeping operation or a self refresh housekeeping operation to maintain the integrity of data stored at the memory. However, performing the housekeeping operation at the mobile device consumes power resources which may negatively impact the ability of the mobile device to continue performing other functions.

III. SUMMARY

A method of controlling the initiation of a housekeeping operation is described. When the mobile device is in a non-charge mode, the method includes conserving a battery life of the mobile device by delaying a housekeeping operation until the mobile device transitions to a charging mode. By re-scheduling the performance of the housekeeping operation to a time when performance of the mobile device is not dependent upon the battery life, the operation of the mobile device during a non-charging mode may be extended.

In a particular embodiment, a method is disclosed that includes, at a mobile device, modifying a scheduled housekeeping operation in response to determining that the mobile device is in a charging mode.

In another particular embodiment, a method of policy-based offloading of a housekeeping operation is disclosed. The method includes detecting that a mobile device is in a charging mode. The method also includes, in response to detecting that the mobile device is in the charging mode, initiating a housekeeping operation at the mobile device in accordance with a system-level policy.

In another particular embodiment, an apparatus is disclosed that includes a first device configured to execute a housekeeping operation. The apparatus also includes a power management integrated circuit configured to determine whether to initiate the housekeeping operation at the first device prior to a scheduled initiation time of the housekeeping operation. The determination is at least partially based on whether the apparatus is charging.

In another particular embodiment, a method includes relaxing a physical design requirement of a device based on an adjustable system-level policy controlled external to the device. The adjustable system-level policy controls performance of a housekeeping operation.

One particular advantage provided by at least one of the disclosed embodiments is that power consumption of a battery of a mobile device may be conserved during a non-charge mode by delaying performance of a housekeeping operation until the mobile device is charging to avoid draining the battery.

Another particular advantage provided by at least one of the disclosed embodiments in which a housekeeping operation is performed at a device based on an adjustable system-level policy is that the cost and the complexity of the device may be reduced by relaxing a design requirement of the device. For example, a memory of the mobile device may be designed to have lower data retention than an industry standard by creating an adjustable system-level policy that schedules and initiates housekeeping operations, such as error correction and self refreshes, more frequently than specified by the industry standard. In this case, the impact on battery performance of performing more housekeeping operations may be reduced by performing the housekeeping operations when the battery is charging.

Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

Figure 9:
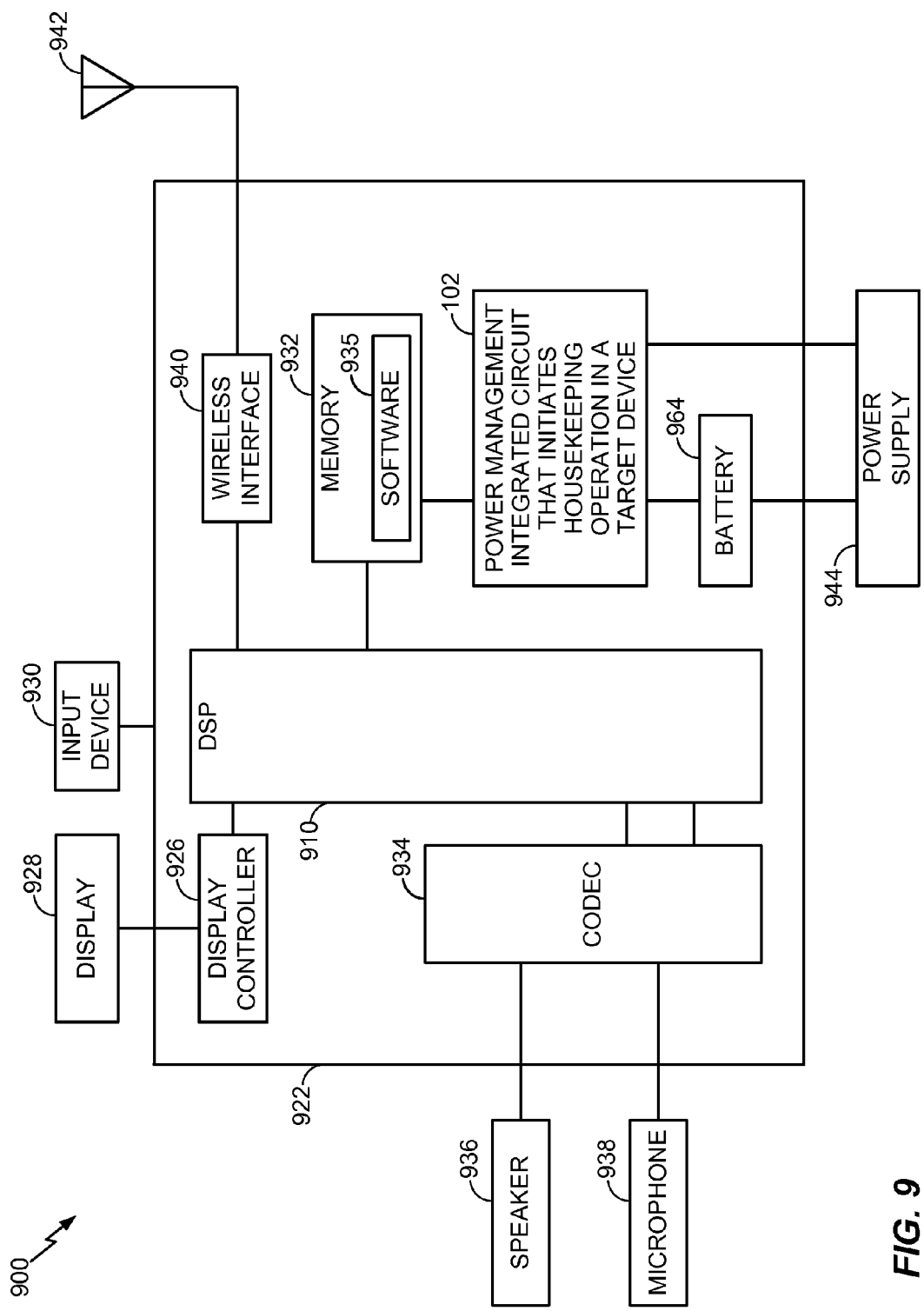
Figure 10:
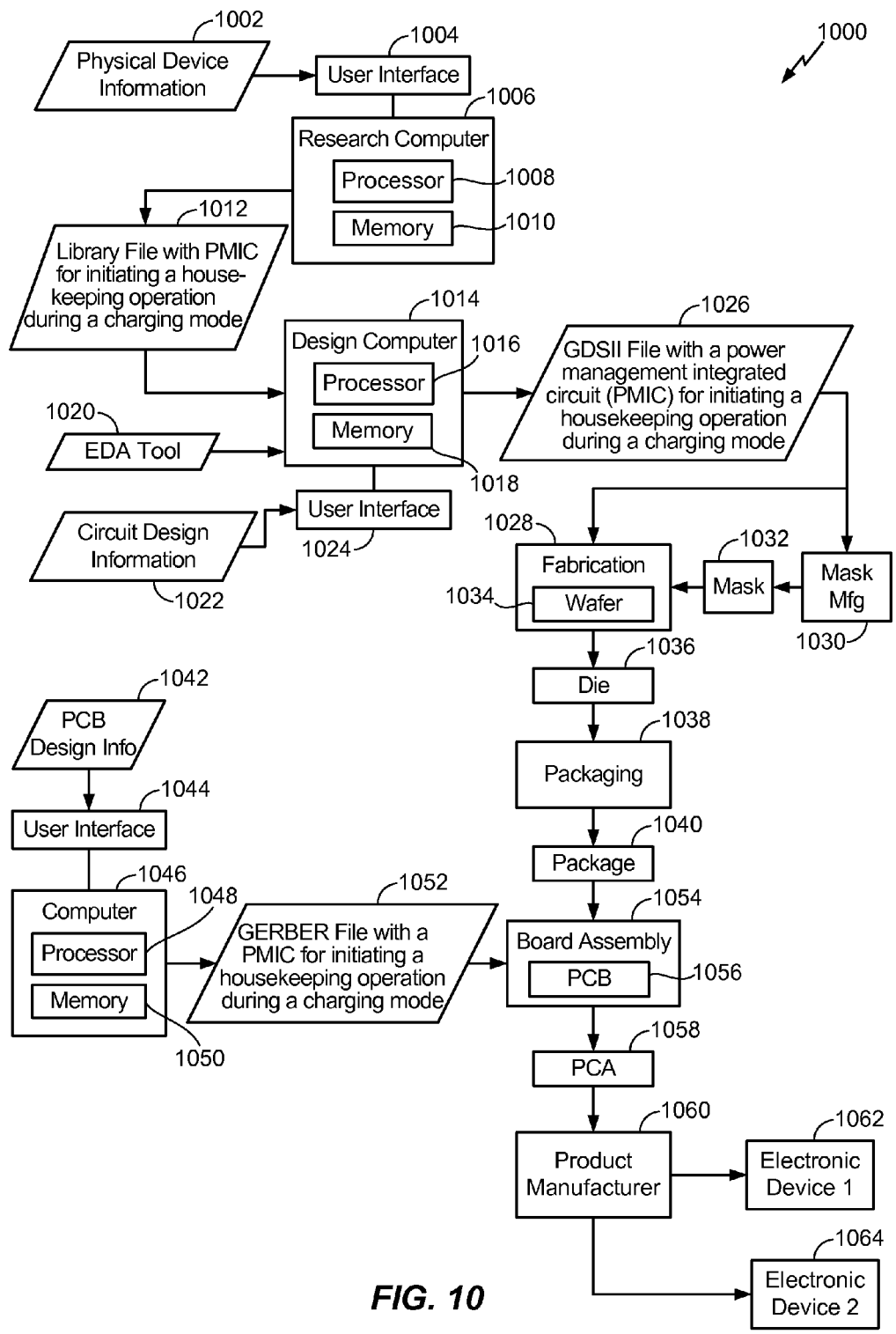

FIG. 9 is a block diagram of a particular embodiment of a wireless communication device that includes a power management integrated circuit that initiates a housekeeping operation based on whether the wireless communication device is charging; and FIG. 10 is a data flow diagram illustrating a manufacturing process for use with a mobile device that initiates a housekeeping operation based on whether the mobile device is charging.

V. DETAILED DESCRIPTION

Figure 1:
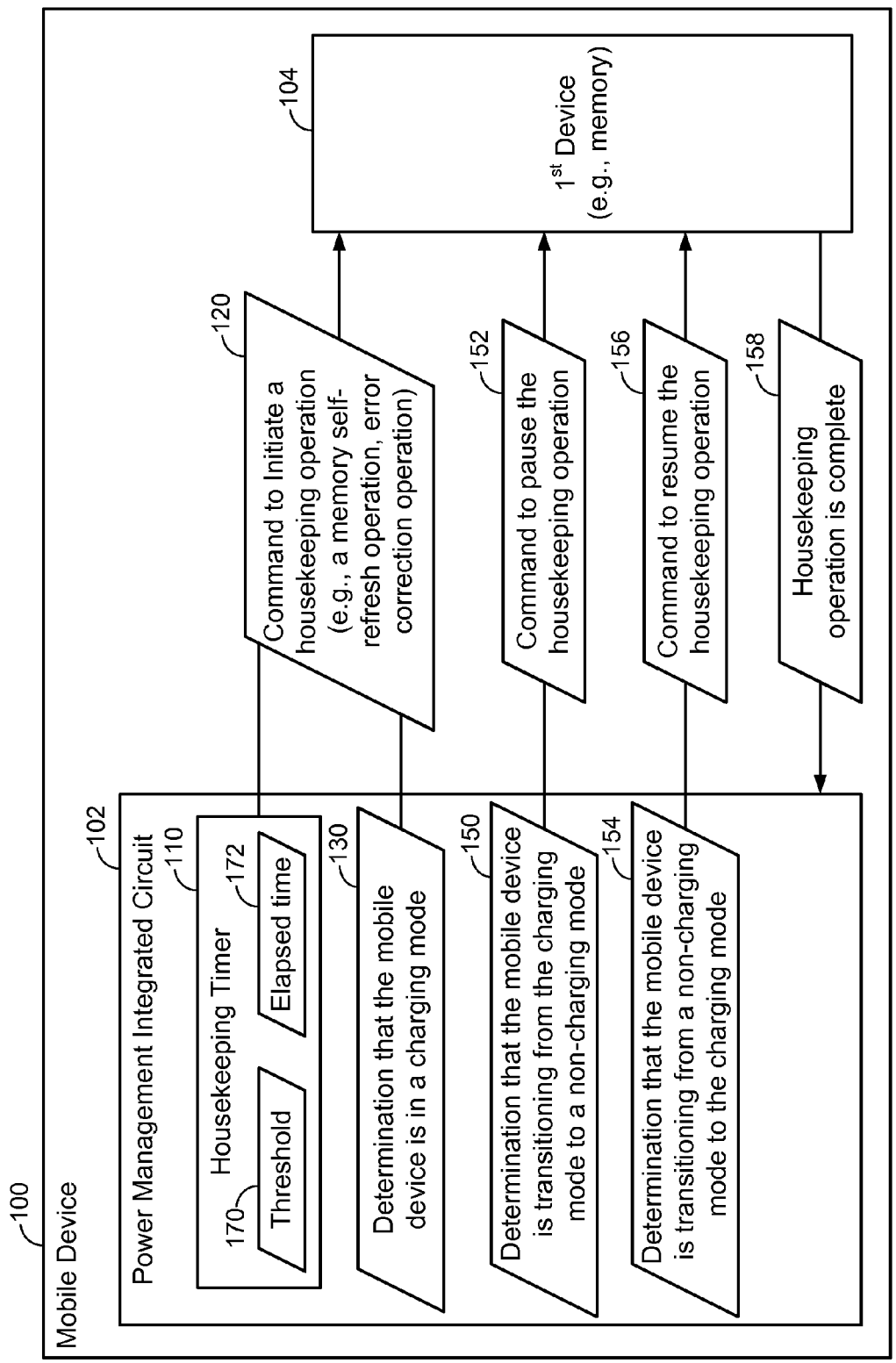
FIG. 1 is a block diagram of a particular illustrative embodiment of a mobile device that initiates a housekeeping operation based whether the mobile device is charging.

Referring to FIG. 1, a particular embodiment of a mobile device 100 is disclosed that initiates a housekeeping operation based whether the mobile device 100 is charging. The mobile device 100 includes a power management integrated circuit (PMIC) 102 and a first device 104. The first device 104 may be a non-volatile memory, a volatile memory, or any other component or device within the mobile device 100. The first device 104 may perform a housekeeping operation to maintain performance of the first device 104. For example, a memory device may periodically perform a self-refresh housekeeping operation or an error correction code (ECC) housekeeping operation to maintain the integrity of data stored at the memory device.

The PMIC 102 may be configured to control whether the housekeeping operation is performed based at least in part on whether the mobile device 100 is in a charging mode (e.g., the mobile device 100 is plugged into an external power source) or a non-charging mode (e.g., the mobile device 100 is unplugged and running on an internal battery). For example, the PMIC 102 may delay a housekeeping operation at the mobile device 100 in a non-charging mode until the mobile device 100 is plugged-in. In this case, the PMIC 102 may transmit to the first device 104 a command 120 to initiate the housekeeping operation in response to a determination 130 that the mobile device 100 is in a charging mode.

The PMIC 102 may also transmit to the first device 104 the command 120 to initiate the housekeeping operation when the mobile device 100 is in a non-charging mode. For example, the PMIC 102 may include a housekeeping timer 110 that indicates an elapsed time 172 from a start of a periodic cycle the housekeeping operation. A threshold 170 may represent a scheduled initiation of the housekeeping operation. When the housekeeping timer 110 exceeds a threshold 170, the PMIC 102 may transmit to the first device 104 the command 120 to initiate the scheduled housekeeping operation. For example, to maintain the performance of a memory, a self-refresh housekeeping operation may be performed before the threshold 170 is exceeded.

After the first device 104 initiates the housekeeping operation, the mobile device 100 may change from the charging mode to a non-charging mode, making performance of the housekeeping operation a drain on limited power resources of the mobile device 100 (e.g., a battery). For example, the mobile device 100 may be unplugged from an external power source and may begin running on an internal battery. In response to a determination 150 that the mobile device 100 is transitioning or has transitioned from the charging mode to a non-charging mode, the first device 104 may receive from the PMIC 102 a command 152 to pause the housekeeping operation. The PMIC 102 may transmit to the first device 104 a command 156 to resume the housekeeping operation in response to a determination 154 that the mobile device 100 is transitioning or has transitioned from a non-charging mode to the charging mode. The PMIC 102 may reset the housekeeping timer 110 in response to receiving an indication 158 that the housekeeping operation is complete. By controlling the housekeeping operation based on whether the mobile device 100 is charging, the power resources of the mobile device 100 may be conserved during a non-charging mode.

Figure 2:
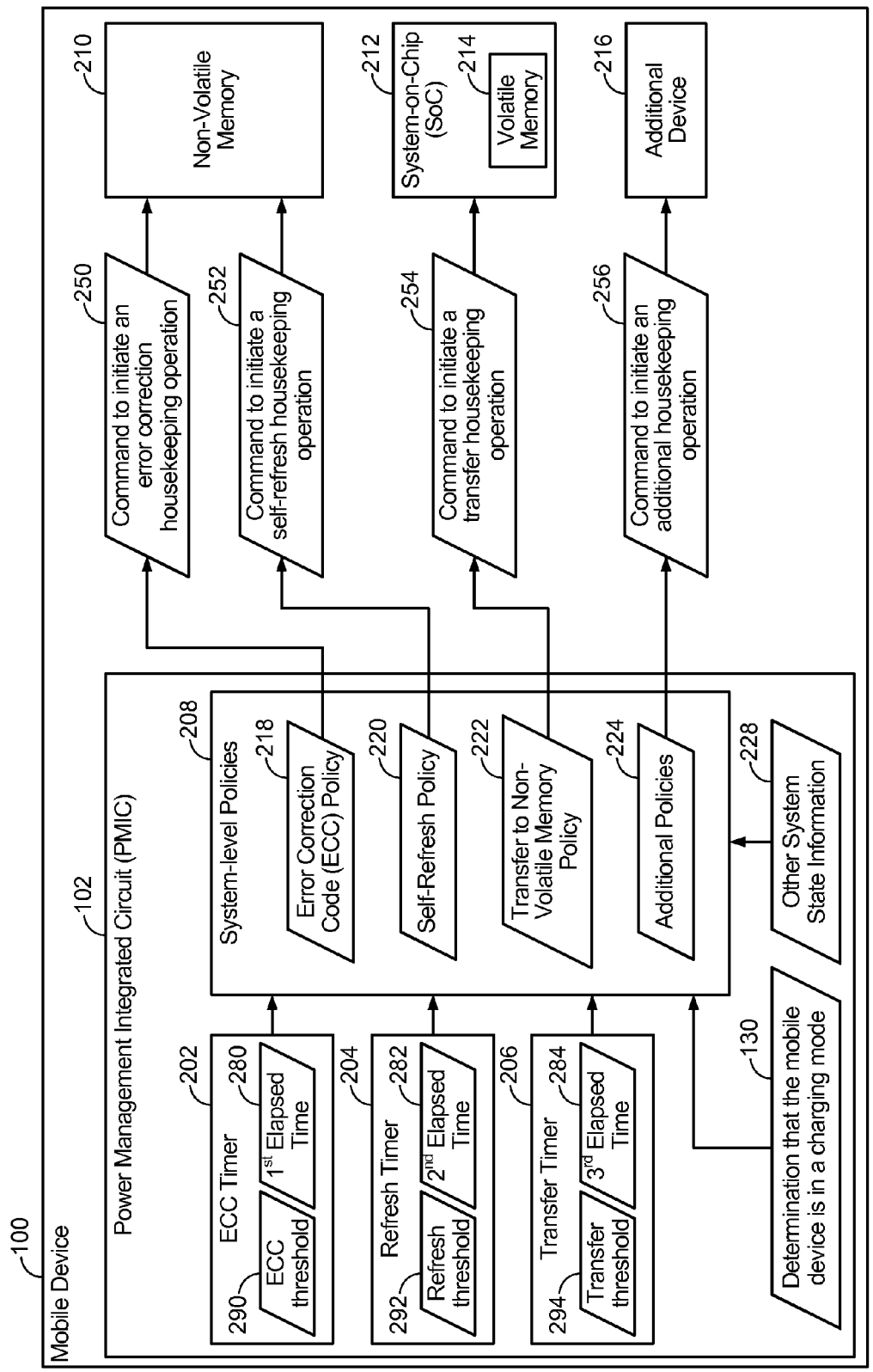
FIG. 2 is a block diagram of a second illustrative embodiment of the mobile device of FIG. 1.

Referring to FIG. 2, a particular embodiment of the mobile device 100 with the power management integrated circuit (PMIC) 102 of FIG. 1 is depicted. The mobile device 100 as depicted in FIG. 2 includes a non-volatile memory 210 and a system-on-chip (SoC) 212 that includes a volatile memory 214. The mobile device 100 may also include one or more additional devices 216. The PMIC 102 may delay performance of a housekeeping operation at the non-volatile memory 210, the SoC 212, and the one or more additional devices 216 based on whether the mobile device 100 is charging.

The PMIC 102 may include one or more timers, each of which is dedicated to tracking an elapsed time of a periodic cycle to perform a housekeeping operation. For example, if the PMIC 102 schedules periodic performance of an error correction code (ECC) housekeeping operation, an ECC timer 202 may be set to track a first elapsed time 280 from a start of an ECC housekeeping operation cycle. A refresh timer 204 may indicate a second elapsed time 282 from a start of a self-refresh housekeeping cycle at the non-volatile memory 210. As another example, the PMIC 102 may include a transfer timer 206 that indicates a third elapsed time 284 from a start of a transfer housekeeping operation cycle.

The PMIC 102 may also include one or more system-level policies 208 that controls scheduling housekeeping operations and controls whether to initiate a housekeeping operation prior to a scheduled initiation time of the housekeeping operation. For example, the system-level policies 208 may include an ECC housekeeping operation policy 218 that controls whether the ECC housekeeping operation is delayed or performed at the non-volatile memory 210. To illustrate, according to the ECC housekeeping operation policy 218, the PMIC 102 may transmit to the non-volatile memory 210 a command 259 to initiate the ECC housekeeping operation when the mobile device 100 is charging. The ECC housekeeping operation policy 218 may also specify that that the PMIC 102 transmit the command 259 to initiate the ECC housekeeping operation in response to the first elapsed time 280 of the ECC timer 202 exceeding the ECC threshold 290 (e.g., 24 hours).

As another example, the system-level policies 208 may include a self-refresh housekeeping operation policy 220 that controls whether the non-volatile memory 210 performs a self-refresh housekeeping operation. To illustrate, according to the self-refresh housekeeping operation policy 220, the PMIC 102 may transmit to the non-volatile memory 210 a command 252 to initiate the self-refresh housekeeping operation when the mobile device 100 is charging. The self-refresh policy 220 may also specify that the PMIC 102 transmit the command 252 to initiate the self-refresh housekeeping operation in response to the second elapsed time 282 of the refresh timer 204 exceeding the refresh threshold 292.

The system-level policies 208 may include a transfer to non-volatile memory policy 222 that indicates whether data stored at the volatile memory 214 may be transferred to the non-volatile memory 210. For example, according to the transfer policy 222, the PMIC 102 may transmit to the SoC 212 a command 254 to initiate the transfer housekeeping operation when the mobile device 100 is charging. The transfer policy 222 may also specify that that the PMIC 102 transmit the command 254 to initiate the transfer housekeeping operation in response to the third elapsed time 284 of the transfer timer 206 exceeding the transfer threshold 294.

The system-level policies 208 may also include any additional policies 224 that control housekeeping operations at the one or more additional devices 216. For example, the PMIC 102 may transmit to the one or more additional devices 216 a command 256 to initiate an additional housekeeping operation based at least in part on one or more of the additional policies 224 and based on the determination 130 that the mobile device 100 is in a charging mode. In addition, the PMIC 102 may initiate one or more housekeeping operations based on other system state information 228 (e.g., information related to power resources, such as a power level of a battery). By controlling the housekeeping operation based on whether the mobile device 100 is charging, the power resources of the mobile device 100 may be conserved during a non-charging mode.

Figure 3:
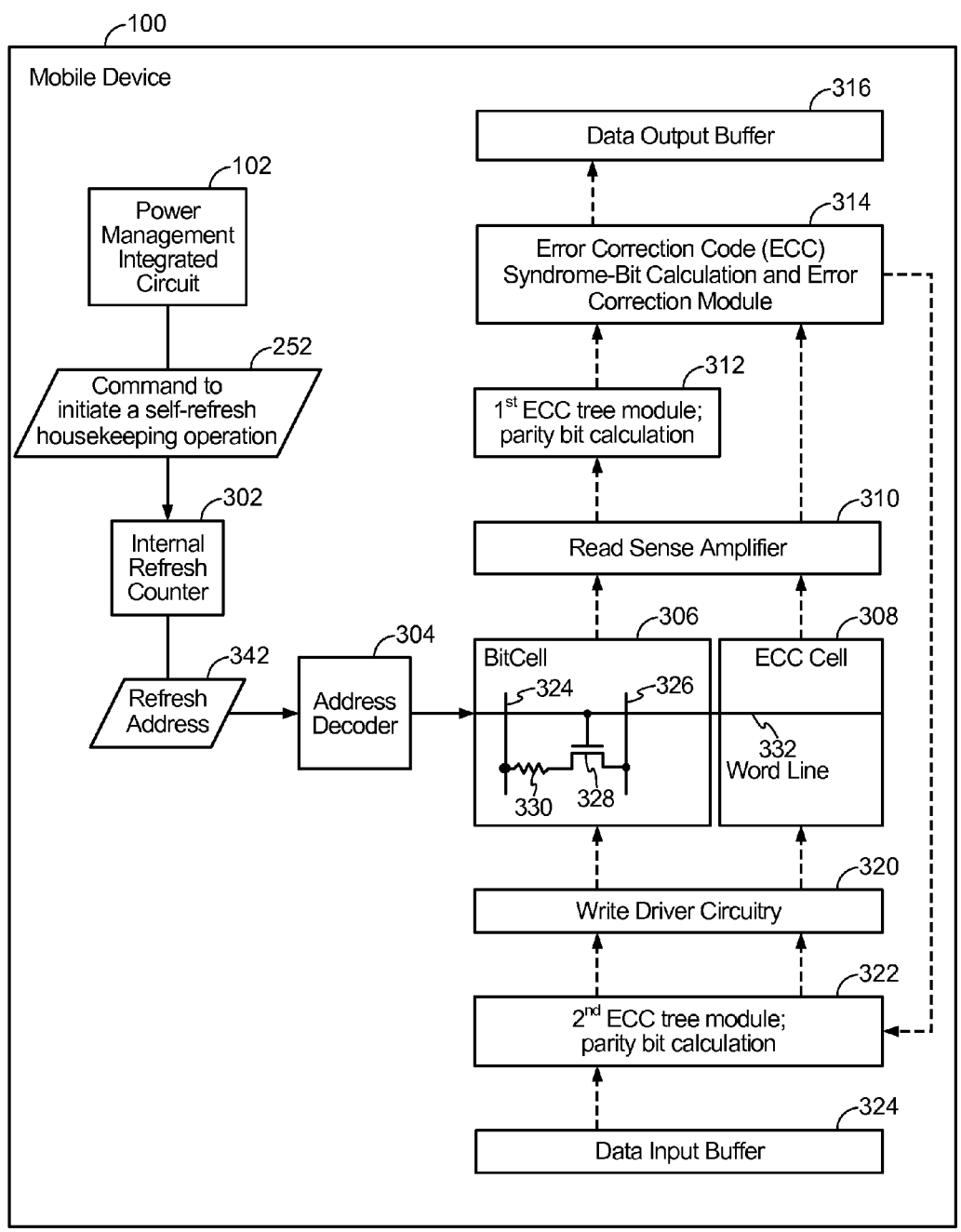
FIG. 3 is a block diagram of a third illustrative embodiment of the mobile device of FIG. 1.

Referring to FIG. 3, a particular embodiment of the mobile device 100 with the power management integrated circuit (PMIC) 102 of FIG. 1 is depicted. The mobile device 100 includes a word line 332 coupled to the representative bitcell 306 to store data and to a representative error correction code (ECC) cell 308 to store error correction data (e.g., a parity bit) corresponding to the data stored in the bitcell 306. The mobile device 100 may include circuitry, such as a read sense amplifier 310, a first ECC tree module 312, an ECC syndrome bit calculation and error correction module 314, and a data output buffer 316, to read and process the data from the bitcell 306 and the error correction data from the ECC cell 308. The mobile device 100 may also include circuitry, such as a write driver circuitry 320, a second ECC tree module 322, and a data input buffer 324, to write data and error correction data, respectively, into the bitcell 306 and into the ECC cell 308.

During operation, the PMIC 102 may control whether a self-refresh housekeeping operation is performed on the bitcell 306. For example, the PMIC 102 may transmit to an internal refresh counter 302 a command 252 to initiate the self-refresh housekeeping operation. In response to receiving the command 252 to initiate the self-refresh housekeeping operation, the internal refresh counter 302 may generate and transmit to an address decoder 304 a refresh address 342. The address decoder 304 may transition a voltage level of a word line 332 that enables data to be written at the bitcell 306. For example, the bitcell 306 may include a resistive memory element 330 that may receive data that is stored via a bit line 324 and is read via a sense line 326. A transistor 328 may control access to the resistive memory element 330 based on a voltage of the word line 332. To illustrate, the bitcell 306 may be a memory cell of a spin transfer torque magnetoresistive random access memory (STT-MRAM) and the resistive memory element 330 may include a magnetic tunnel junction (MTJ) device.

The read sense amplifier 310 may read data stored in the bitcell 306 and error correction data stored at the ECC cell 308. The data read from the bitcell 306, along with other data corresponding to a ECC word (e.g. multiple bitcells along the word line 332 that are accessed during a read operation) may be provided to the first ECC tree module 312 to generate a parity bit calculation that is provided to the ECC syndrome bit calculation and error correction module 314. The ECC syndrome bit calculation and error correction module 314 may receive an output of the ECC tree module 312 and ECC bits (e.g. an ECC bit read from the ECC cell 308). The ECC syndrome bit calculation and error correction module 314 may generate syndrome bits and use the syndrome bits to correct errors in the data corresponding to the ECC word. The corrected data may be output to the data output buffer 316.

After correction, the data may be re-encoded and stored back to the cells (e.g. a data bit is stored in the bitcell 306 and a parity bit is stored in the ECC cell 308). The data may be provided to the second ECC tree module 322 that calculates one or more parity bits based on the corrected data. The write driver circuitry 320 writes the corrected data and parity to the memory array including the bitcell 306 and the ECC cell 308.

As a result, data read from the memory may be corrected, re-encoded, and written back to the memory. By controlling the reading and writing to the bitcell 306 during an ECC housekeeping operation based on the PMIC 102, the ECC housekeeping operation may be performed at times that do not drain a battery of the mobile device 100. However, the ECC housekeeping may be performed during battery mode depending on how the ECC policy is defined.

Although described with respect to ECC correction, in other embodiments the system depicted in FIG. 3 may alternatively, or in addition, be used to perform non-volatile self-refresh without error correction. For example, in response to the mobile device 100 entering a charge-mode, the PMIC 102 may generate a series of refresh commands to the non-volatile memory. The internal refresh counter 302 may generate refresh addresses to execute self-refresh commands.

As illustrated in FIG. 3, ECC/refresh management may be moved to a non-critical path to reduce or remove impact on system performance and bit errors may be frequently detected and corrected to prevent accumulation of bit errors that may ultimately cause the ECC to fail. In addition, the system of FIG. 3 enables lower stress/energy of memory cells by relaxing the data retention criteria. For example, because ECC/refresh is controlled according to a system-based policy, data may be stored using less energy as compared to systems that can experience long periods of inactivity and therefore must write data using higher energy for longer data retention to reduce data corruption.

Figure 4:
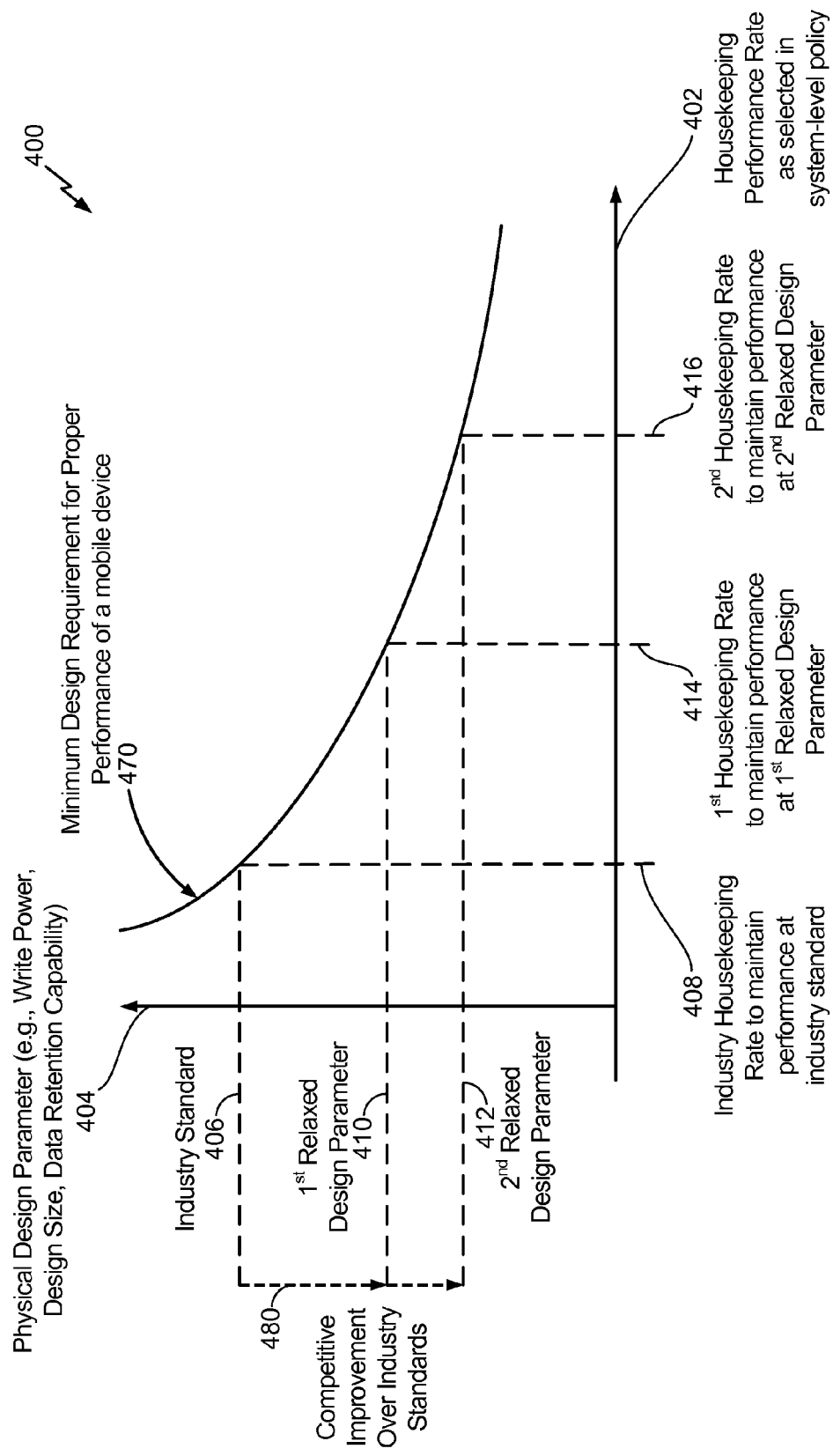
FIG. 4 is a graph depicting how a rate of performance of a housekeeping operation of a device may be adjusted to compensate for a relaxation of a physical design parameter of the device.

Referring to FIG. 4, a graph 400 depicts how a rate 402 of performance of a housekeeping operation of a device may be adjusted to compensate for a relaxation of a physical design parameter 404 (e.g., data retention capabilities, write power, design size) of the device.

An industry design parameter standard 406 may require an industry housekeeping performance rate 408 to maintain a proper performance 470 of the mobile device 100 of FIG. 1. When performance of a housekeeping operation of a device (e.g., non-volatile memory) of the mobile device is controlled based on one of the system-level policies 208 of FIG. 2, the design parameter 404 may be relaxed. For example, by increasing the housekeeping performance rate, the data retention capability of the non-volatile memory of the mobile device 100 may be reduced, thus reducing the costs of the non-volatile memory and providing a competitive improvement over the industry design parameter standard 406. To illustrate, the system-level policy may specify a first housekeeping performance rate 414 to maintain the proper performance 470 of the first relaxed design parameter 410. The first housekeeping performance rate 414 may be higher than the industry housekeeping performance rate 408, enabling the first relaxed design parameter 410 to be designed with a lower data retention capability compared to the industry design parameter standard 406. As another example, a second relaxed design parameter 412 may be designed to have a further competitive improvement 480 over the industry standard by specifying a second housekeeping performance rate 416 that has a higher housekeeping performance rate (relative to the industry housekeeping performance rate 408 and the first housekeeping performance rate 414) in the system-level policy.

Other physical design parameters may be relaxed as a result of periodic refreshing according to a system-level refresh policy. For example, in non-volatile memories, power may be saved by further circuit optimizations (e.g. by downsizing write drivers). As another example, reliability can be improved by lowering stress experienced by memory cells, such as by lowering voltage. As yet another example, a cell hysteresis requirement can be traded with retention to lower stress/energy. Relaxing design parameters may enable a mobile device to be built at a reduced cost or with less complex components.

Figure 5:
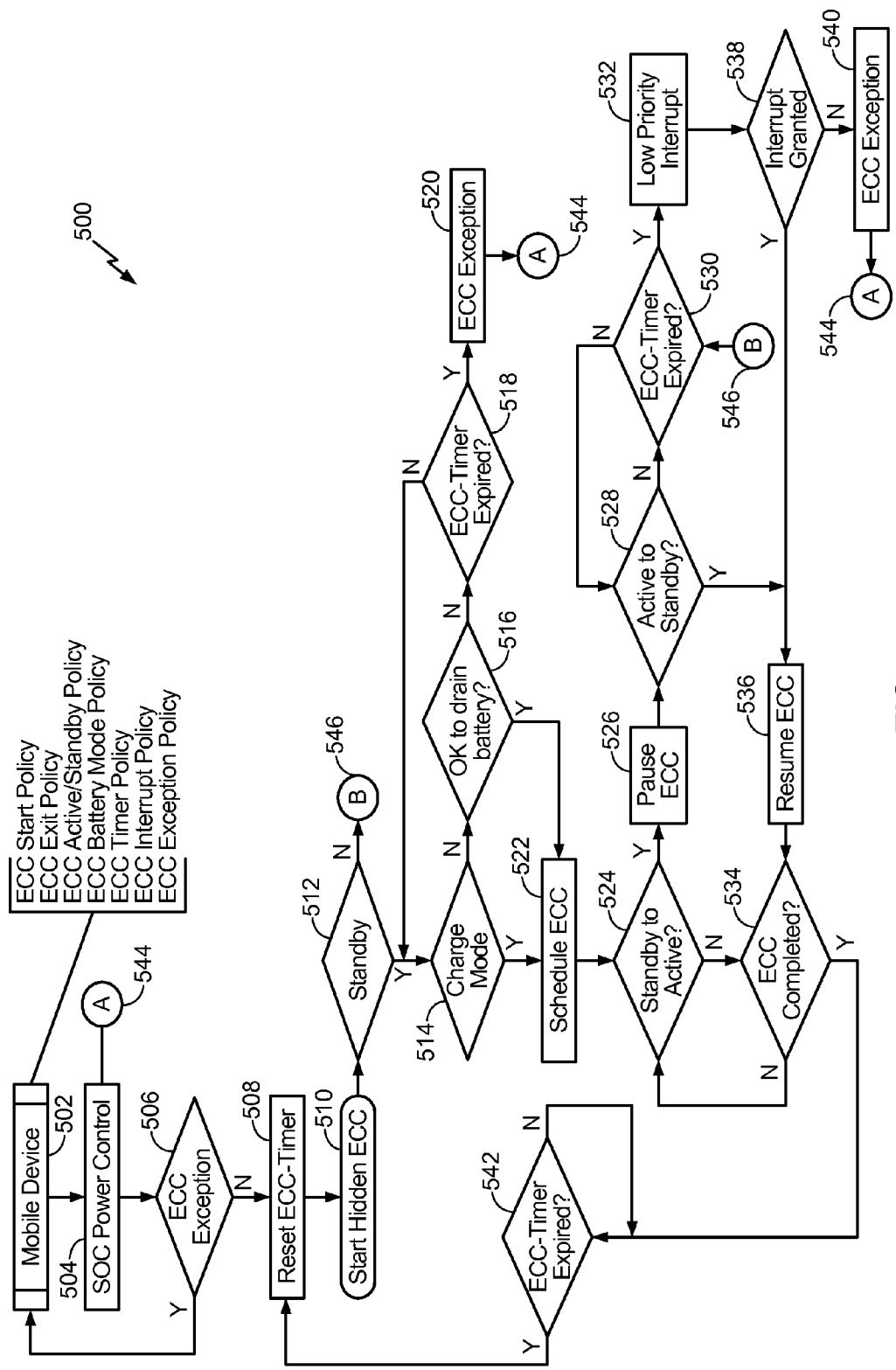
FIG. 5 is a flow chart of a particular illustrative embodiment of a method of initiating a housekeeping operation at a mobile device based on whether the mobile device is charging.

Referring to FIG. 5, a particular embodiment of a method 500 of initiating an error correction code (ECC) housekeeping operation at a mobile device based on a charging mode of the mobile device is disclosed. The method 500 commences at block 502 with the mobile device deciding whether to perform the ECC housekeeping operation based on ECC system-level policies, such as a start policy that indicates when to start the ECC housekeeping operation, an exit policy that indicates when to stop the ECC housekeeping operation, an active/standby policy that indicates whether the ECC housekeeping operation is performed in an active mode, a battery mode policy that indicates whether the ECC housekeeping operation is performed in a battery mode, a timer policy that indicates whether the ECC housekeeping operation may be delayed, an interrupt policy that indicates whether an interrupt related to the ECC housekeeping operation is granted, and an exception policy that indicates if the ECC housekeeping operation may be performed in response to an exception, such as a reboot or shut-down of the mobile device, at 502.

At block 504, a system-on-chip (SoC) power control may indicate whether an ECC exception has occurred. If an ECC exception has occurred, at block 506, the mobile device decides whether to perform the ECC housekeeping operation or otherwise handle the ECC exception, such as according to the ECC exception policy. If an ECC exception has not occurred, at 506, an ECC timer is reset at block 508 and a hidden ECC housekeeping operation is initiated at block 510. At block 512, a determination is made whether the mobile device is in a standby mode. If the mobile device is not in a standby mode, the method proceeds via block 546 to block 530. If the mobile device is in standby, the method proceeds to block 514 where a determination is made whether the mobile device is in a charging mode. If the mobile device is not charging, a determination of whether it is ok to drain a battery of the mobile device is made at block 516. For example, the ECC battery mode policy may indicate conditions under which the battery may be drained. If the battery may be drained, the method proceeds to block 522 to schedule the ECC housekeeping operation. If the battery may not be drained, a determination at block 518 of whether the ECC timer has expired may be made. In response to determining that the ECC timer has not expired, the method returns to block 514. If the ECC timer has expired, an ECC exception is generated at 520 and transmitted via block 544 to block 504.

Returning to block 514, in response to determining that the mobile device is charging, performance of the ECC housekeeping operation may be initiated (i.e., schedule the ECC housekeeping operation), at block 522. After initiating the ECC housekeeping operation, a determination is made whether the mobile device is transitioning or has transitioned from a standby mode to an active mode, at block 524. If the mobile device transitions to an active mode, the ECC housekeeping operation may be paused, at block 526. In this case, a determination is made at block 528 whether the mobile device transitions from the active mode to the standby mode. In response to the mobile device transitioning to the standby mode, the ECC housekeeping operation may be resumed, at block 536. Returning to block 528, if the mobile device is not transitioning to the standby mode, a determination of whether the ECC timer has expired (e.g., an elapsed time exceeds a threshold) is made. If the ECC timer has not expired, the method returns to block 528. If the ECC timer has expired, a low priority interrupt may be generated, at block 532. At block 538, a determination is made whether the interrupt is granted. If the interrupt is granted, the method proceeds to block 536. If the interrupt is not granted, an ECC exception is generated and transmitted via the block 544 to block 504.

Returning to block 536, the method proceeds to block 534 where a determination is made whether the ECC housekeeping operation is complete. If the ECC housekeeping operation is not complete, the method returns to block 524. If the ECC housekeeping operation is complete, the method determines at block 542 whether the ECC timer has expired. If the ECC timer has not expired, the method returns to block 542. If the ECC timer has expired, the ECC timer is reset at block 508.

Figure 6:
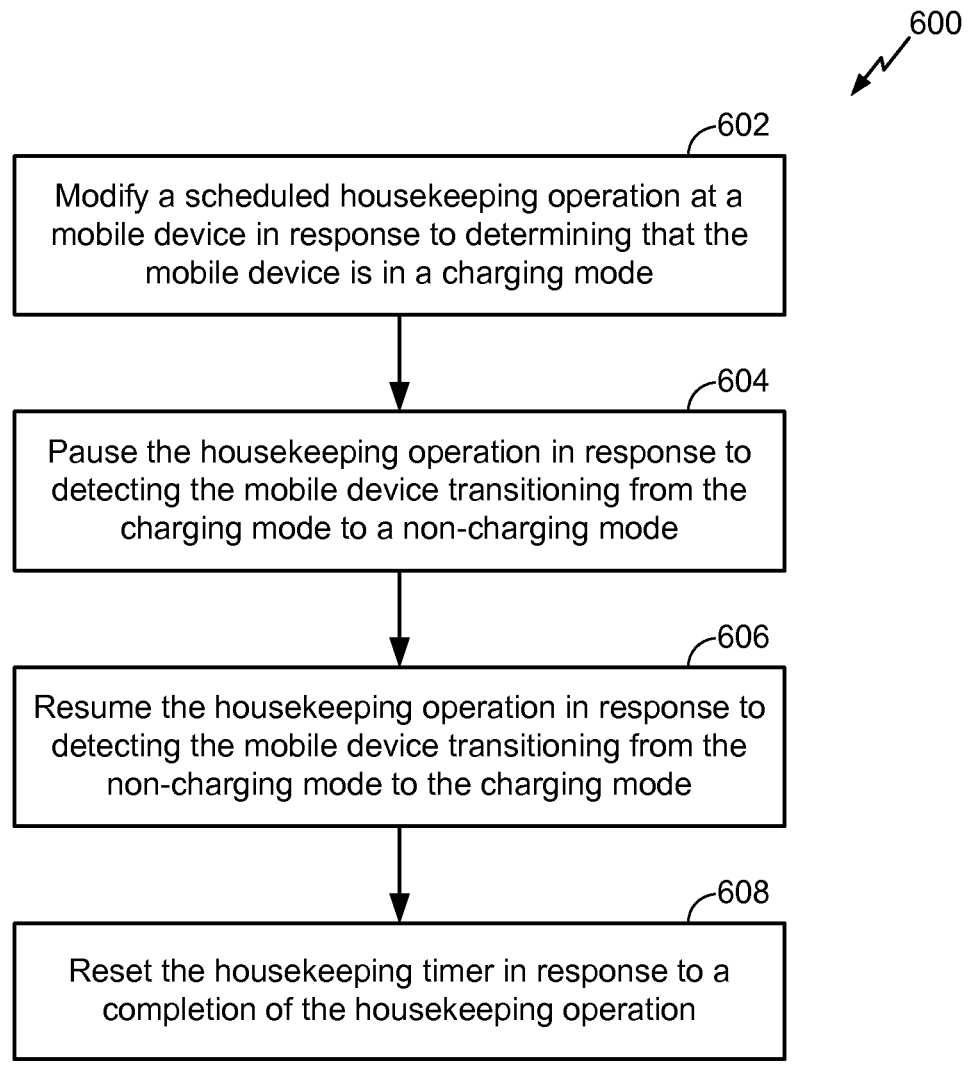
FIG. 6 is a flow chart of a second illustrative embodiment of a method of initiating a housekeeping operation at a mobile device based on whether the mobile device is charging.

Referring to FIG. 6, a particular embodiment of a method 600 of initiating a housekeeping operation at a mobile device based on whether the mobile device is charging is disclosed. The method 600 includes, at a mobile device, modifying a scheduled housekeeping operation in response to determining that the mobile device is in a charging mode, at 602. The housekeeping operation may be scheduled to be initiated when a housekeeping timer, such as the housekeeping timer 110 of FIG. 1, exceeds a threshold. In the example of FIG. 1, in response to the determination 130 that the mobile device 100 is charging, the power management integrated circuit 102 may transmit the command 120 that initiates the housekeeping operation at the mobile device 100. The housekeeping operation may include an error correction operation, a memory self-refresh operation, a transfer operation from volatile memory to non-volatile memory, or any combination thereof.

The method 600 may also include pausing the housekeeping operation in response to detecting the mobile device transitioning from the charging mode to a non-charging mode, at 604. For example, in FIG. 1, in response to the determination 150 that the mobile device 100 is transitioning from the charging mode to a non-charging mode, the power management integrated circuit 102 transmits the command 152 that pauses the housekeeping operation.

The method 600 may also include resuming the housekeeping operation in response to detecting the mobile device transitioning from the non-charging mode to the charging mode, at 606. For example, in FIG. 1, in response to the determination 154 the mobile device 100 transitioning from a non-charging mode to the charging mode, the power management integrated circuit 102 transmits the command 156 that resumes the housekeeping operation.

The method 600 may also include resetting the housekeeping timer in response to a completion of the housekeeping operation, at 608. For example, in FIG. 1, the power management integrated circuit 102 may reset the housekeeping timer 110 in response to the indication 158 that the housekeeping operation is complete.

Figure 7:
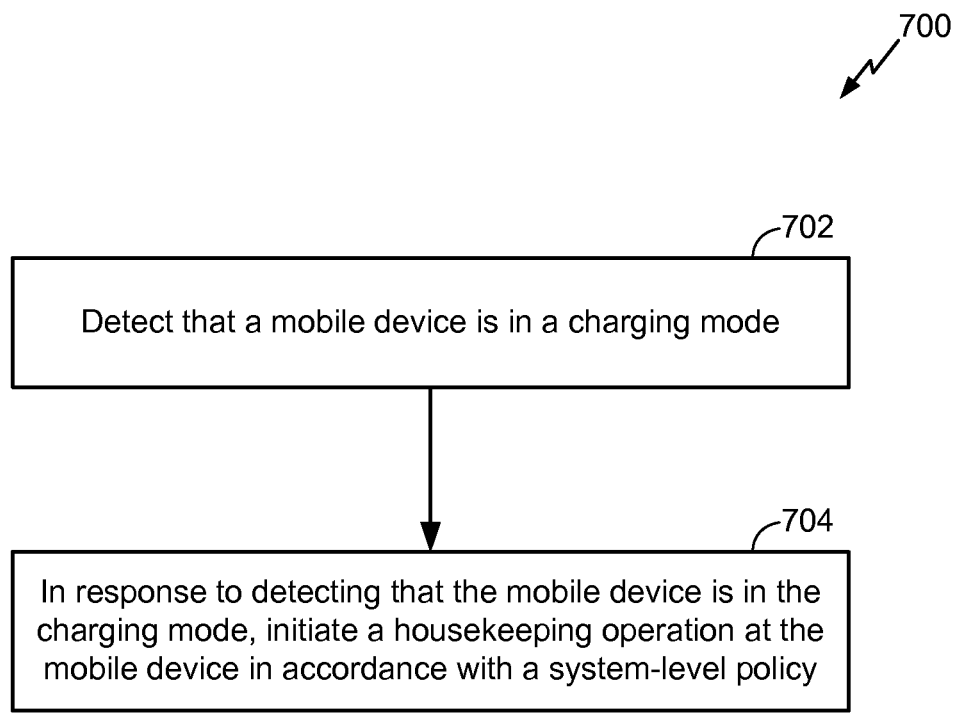
FIG. 7 is a flow chart of a particular embodiment of a method of policy-based offloading of a housekeeping operation.

Referring to FIG. 7, a particular embodiment of a method 700 of policy-based offloading of a housekeeping operation is disclosed. The method 700 includes detecting that a mobile device is in a charging mode, at 702. For example, in FIG. 2, the power management integrated circuit 102 makes the determination 130 that the mobile device 100 is in the charging mode.

In response to detecting that the mobile device is in the charging mode, the housekeeping operation is initiated at the mobile device in accordance with a system-level policy, at 704. The housekeeping operation may be applied to a first device within the mobile device. For example, the first device may be one of a system-on-a-chip and a memory. The system-level policy may be controlled external to the first device. For example, in FIG. 2, the power management integrated circuit 102, in response to the determination 130 that the mobile device 100 is in the charging mode, initiates housekeeping operations at the non-volatile memory 210, the SoC 212, and the additional device 216 via the commands 250-256 in accordance with an associated system-level policy 218-224. The system-level policy may be user programmable.

The system-level policy may include initiating the housekeeping operation prior to the scheduled time when the mobile device is in the charging mode. In addition, the system-level policy may include initiating the housekeeping operation when the mobile device is in a non-charging mode in response to determining that a housekeeping timer exceeds a threshold. The housekeeping timer tracks an elapsed time since a previous completion of the housekeeping operation. For example, the ECC timer of FIG. 5 tracks an elapsed time since resetting the ECC timer at block 508 and starting the ECC housekeeping operation at block 510.

Figure 8:
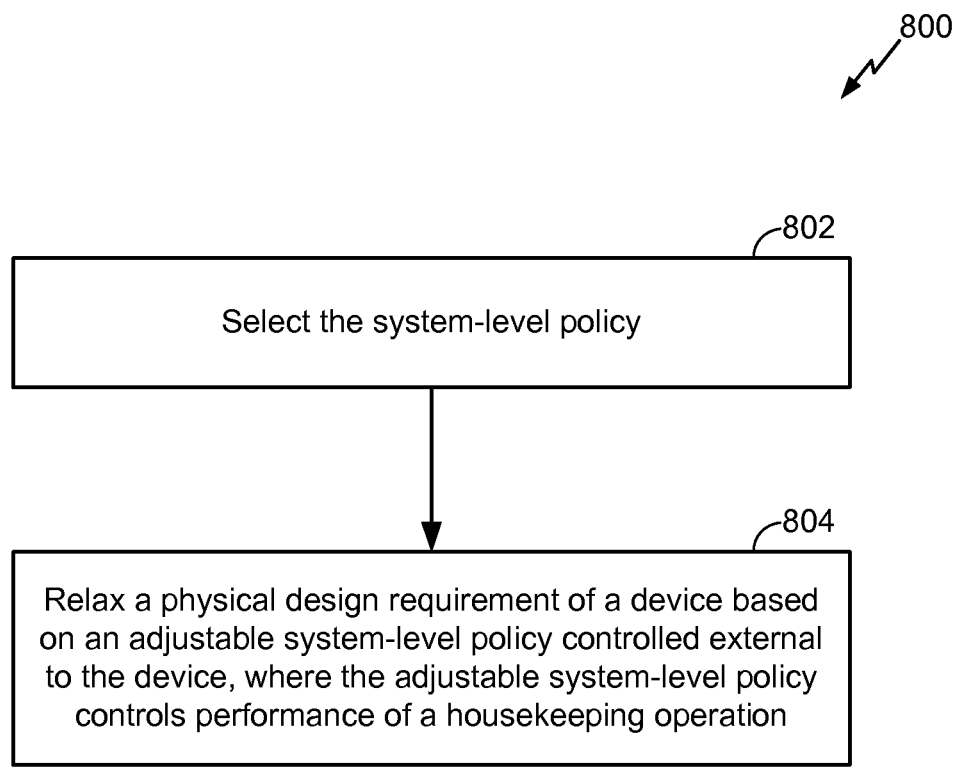
FIG. 8 is a flow chart of a particular illustrative embodiment of a method of designing a mobile device that initiates a housekeeping operation based on whether the mobile device is charging.

Referring to FIG. 8, a particular embodiment of a method 800 of designing a mobile device that initiates a housekeeping operation based on whether the mobile device is charging is disclosed. The method 800 includes selecting a system-level policy, at 802. For example, in FIG. 2, the mobile device 100 selects the system-level policy (e.g., the ECC housekeeping operation policy 218, the self-refresh housekeeping operation policy 220, the transfer to non-volatile memory policy 222, or the additional policies 224). As another example, in FIG. 4, a selection of the housekeeping performance rate 402 based on the system-level policy is illustrated.

The method 800 also includes relaxing a physical design requirement of a device (e.g., the non-volatile memory 210, the system-on-chip 212, and additional devices 216) based on the adjustable system-level policy controlled external to the device, where the adjustable system-level policy controls performance of a housekeeping operation, at 804. For example, in FIG. 2, the power management integrated circuit 102 may control a system-level policy (e.g., the error housekeeping operation policy 218, the self-refresh policy 220, the transfer to non-volatile memory policy 222, or additional policies 224) that specifies when to perform a housekeeping operation at the device. As another example, in FIG. 4, a design parameter 404 is relaxed based on a housekeeping performance rate 402 as selected in the system-level policy.

As an example, relaxing the physical design requirement may include reducing a write current for a data write current for a date write operation of the device. As another example, relaxing the design requirement may include selecting a data retention characteristic of the device based on the system-level policy. Selecting the data retention characteristic may include reducing a retention capability of memory in the mobile device. The retention capability of the memory may be reduced in response to selecting in the system-level policy an increase in a refresh rate of the memory. For example, in FIG. 4, the retention capability 404 of a memory in the device is reduced (from the industry standard 406 to the first relaxed design parameter 410) in response to selecting an increased refresh rate of the memory (housekeeping performance rate 402 is increased from the industry minimum requirement 408 to the first housekeeping performance rate 414).

FIG. 9 is a block diagram of an embodiment of a wireless communication device 900 that includes the power management integrated circuit 102 of FIG. 1. The wireless communication device 900 may be implemented as a portable wireless electronic device that includes a processor 910, such as a digital signal processor (DSP), coupled to a memory 932.

The power management integrated circuit (PMIC) 102 may control a housekeeping operation of one or more of the devices within the wireless communication device 900 based on a determination of whether the wireless communication device 900 is charging. The PMIC 102 may monitor a battery 964 and a power supply 944 to determine whether the wireless communication device 900 is charging. The power management integrated circuit 102 may include one or more components, memories, or circuits described in FIGS. 1-3 and operate in accordance with the methods of FIGS. 5-8, or any combination thereof.

In a particular embodiment, a display controller 926 is coupled to the processor 910 and to a display device 928. A coder/decoder (CODEC) 934 can also be coupled to the processor 910. A speaker 936 and a microphone 938 can be coupled to the CODEC 934. A wireless controller 940 can be coupled to the processor 910 and to a wireless antenna 942.

The memory 932 may include a computer readable medium that stores instructions (e.g., software 935) that are executable by a processor, such as the processor 910. For example, the software 935 may include instructions that are executable by the processor 910 or a processor in the PMIC 102 to detect that a mobile device (e.g., the mobile device of FIG. 1) is in a charging mode. The software 935 may also include instructions that are executable by a processor to initiate a housekeeping operation at the mobile device in accordance with a system-level policy in response to detecting that the mobile device (e.g., the mobile device 100 of FIG. 1) is in the charging mode.

In a particular embodiment, the PMIC 102, the signal processor 910, the display controller 926, the memory 932, the CODEC 934, and the wireless controller 940 are included in a system-in-package device 922. In a particular embodiment, an input device 930 and the power supply 944 are coupled to the system-in-package device 922. Moreover, in a particular embodiment, as illustrated in FIG. 9, the display device 928, the input device 930, the speaker 936, the microphone 938, the wireless antenna 942, and the power supply 944 are external to the system-in-package device 922. However, each of the display device 928, the input device 930, the speaker 936, the microphone 938, the wireless antenna 942, and the power supply 944 can be coupled to a component of the system-in-package device 922, such as an interface or a controller.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above.

FIG. 10 depicts a particular illustrative embodiment of an electronic device manufacturing process 1000. Physical device information 1002 is received at the manufacturing process 1000, such as at a research computer 1006. The physical device information 1002 may include design information representing at least one physical property of a semiconductor device, such as the power management integrated circuit 102 of FIGS. 1-3, the non-volatile memory 210 or the volatile memory 214 of FIG. 2, the access transistor 328 or the resistive memory element 330 of FIG. 3, or any combination thereof. For example, the physical device information 1002 may include physical parameters, material characteristics, and structure information that is entered via a user interface 1004 coupled to the research computer 1006. The research computer 1006 includes a processor 1008, such as one or more processing cores, coupled to a computer readable medium such as a memory 1010. The memory 1010 may store computer readable instructions that are executable to cause the processor 1008 to transform the physical device information 1002 to comply with a file format and to generate a library file 1012.

In a particular embodiment, the library file 1012 includes at least one data file including the transformed design information. For example, the library file 1012 may include a library of semiconductor devices including a device that includes the power management integrated circuit 102 of FIGS. 1-3, or any combination thereof, that is provided to use with an electronic design automation (EDA) tool 1020.

The library file 1012 may be used in conjunction with the EDA tool 1020 at a design computer 1014 including a processor 1016, such as one or more processing cores, coupled to a memory 1018. The EDA tool 1020 may be stored as processor executable instructions at the memory 1018 to enable a user of the design computer 1014 to design a circuit including a device that includes the power management integrated circuit 102 of FIGS. 1-3, or any combination thereof, of the library file 1012. For example, a user of the design computer 1014 may enter circuit design information 1022 via a user interface 1024 coupled to the design computer 1014. The circuit design information 1022 may include design information representing at least one physical property of a semiconductor device, such as a device that includes the power management integrated circuit 102 of FIGS. 1-3, or any combination thereof. To illustrate, the circuit design property may include identification of particular circuits and relationships to other elements in a circuit design, positioning information, feature size information, interconnection information, or other information representing a physical property of a semiconductor device.

The design computer 1014 may be configured to enable a designer to relax a physical design requirement of a device based on an adjustable system-level policy that is controlled external to the device and that controls performance of a housekeeping operation. For example, the design computer 1014 may executable instructions at the memory 1018 that are executable by a processor of the design computer 1014 to select the system-level policy or to receive a user selection of the system-level policy and to relax a design requirement or to receive a user input relaxing the design requirement. For example, relaxing the design requirement may include selecting a data retention characteristic of the device based on the system-level policy. The design computer 1014 may enable performance of the method described with respect to FIG. 8.

The design computer 1014 may be configured to transform the design information, including the circuit design information 1022, to comply with a file format. To illustrate, the file formation may include a database binary file format representing planar geometric shapes, text labels, and other information about a circuit layout in a hierarchical format, such as a Graphic Data System (GDSII) file format. The design computer 1014 may be configured to generate a data file including the transformed design information, such as a GDSII file 1026 that includes information describing the power management integrated circuit 102 of FIGS. 1-3, a device having a relaxed physical design requirement such as the non-volatile memory 210 of FIG. 2, the volatile memory 214 of FIG. 2, or the bitcell 306 of FIG. 3, or any combination thereof, in addition to other circuits or information. To illustrate, the data file may include information corresponding to a system-on-chip (SOC) that includes the power management integrated circuit 102 of FIGS. 1-3 and that also includes additional electronic circuits and components within the SOC such as a device having a relaxed physical design requirement such as the non-volatile memory 210 of FIG. 2, the volatile memory 214 of FIG. 2, or the bitcell 306 of FIG. 3.

The GDSII file 1026 may be received at a fabrication process 1028 to manufacture the power management integrated circuit 102 of FIGS. 1-3, a device having a relaxed physical design requirement such as the non-volatile memory 210 of FIG. 2, the volatile memory 214 of FIG. 2, or the bitcell 306 of FIG. 3, or any combination thereof, according to transformed information in the GDSII file 1026. For example, a device manufacture process may include providing the GDSII file 1026 to a mask manufacturer 1030 to create one or more masks, such as masks to be used with photolithography processing, illustrated as a representative mask 1032. The mask 1032 may be used during the fabrication process to generate one or more wafers 1034, which may be tested and separated into dies, such as a representative die 1036. The die 1036 includes a circuit including a device that includes the power management integrated circuit 102 of FIGS. 1-3, a device having a relaxed physical design requirement such as the non-volatile memory 210 of FIG. 2, the volatile memory 214 of FIG. 2, or the bitcell 306 of FIG. 3, or any combination thereof.

The die 1036 may be provided to a packaging process 1038 where the die 1036 is incorporated into a representative package 1040. For example, the package 1040 may include the single die 1036 or multiple dies, such as a system-in-package (SiP) arrangement. The package 1040 may be configured to conform to one or more standards or specifications, such as Joint Electron Device Engineering Council (JEDEC) standards.

Information regarding the package 1040 may be distributed to various product designers, such as via a component library stored at a computer 1046. The computer 1046 may include a processor 1048, such as one or more processing cores, coupled to a memory 1050. A printed circuit board (PCB) tool may be stored as processor executable instructions at the memory 1050 to process PCB design information 1042 received from a user of the computer 1046 via a user interface 1044. The PCB design information 1042 may include physical positioning information of a packaged semiconductor device on a circuit board, the packaged semiconductor device corresponding to the package 1040 including the power management integrated circuit 102 of FIGS. 1-3, a device having a relaxed physical design requirement such as the non-volatile memory 210 of FIG. 2, the volatile memory 214 of FIG. 2, or the bitcell 306 of FIG. 3, or any combination thereof.

The computer 1046 may be configured to transform the PCB design information 1042 to generate a data file, such as a GERBER file 1052 with data that includes physical positioning information of a packaged semiconductor device on a circuit board, as well as layout of electrical connections such as traces and vias, where the packaged semiconductor device corresponds to the package 1040 including the power management integrated circuit 102 of FIGS. 1-3, a device having a relaxed physical design requirement such as the non-volatile memory 210 of FIG. 2, the volatile memory 214 of FIG. 2, or the bitcell 306 of FIG. 3, or any combination thereof. In other embodiments, the data file generated by the transformed PCB design information may have a format other than a GERBER format.

The GERBER file 1052 may be received at a board assembly process 1054 and used to create PCBs, such as a representative PCB 1056, manufactured in accordance with the design information stored within the GERBER file 1052. For example, the GERBER file 1052 may be uploaded to one or more machines to perform various steps of a PCB production process. The PCB 1056 may be populated with electronic components including the package 1040 to form a representative printed circuit assembly (PCA) 1058.

The PCA 1058 may be received at a product manufacture process 1060 and integrated into one or more electronic devices, such as a first representative electronic device 1062 and a second representative electronic device 1064. As an illustrative, non-limiting example, the first representative electronic device 1062, the second representative electronic device 1064, or both, may be selected from the group of a set top box, a music player, a video player, an entertainment unit, a navigation device, a communications device, a personal digital assistant (PDA), a fixed location data unit, and a computer, into which the power management integrated circuit 102 is integrated. As another illustrative, non-limiting example, one or more of the electronic devices 1062 and 1064 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 10 illustrates remote units according to teachings of the disclosure, the disclosure is not limited to these exemplary illustrated units. Embodiments of the disclosure may be suitably employed in any device which includes active integrated circuitry including memory and on-chip circuitry.

A device that includes or that is configured with relaxed physical design requirements for use with the power management integrated circuit 102 of FIGS. 1-3, or any combination thereof, may be fabricated, processed, and incorporated into an electronic device, as described in the illustrative process 1000. One or more aspects of the embodiments disclosed with respect to FIGS. 1-9 may be included at various processing stages, such as within the library file 1012, the GDSII file 1026, and the GERBER file 1052, as well as stored at the memory 1010 of the research computer 1006, the memory 1018 of the design computer 1014, the memory 1050 of the computer 1046, the memory of one or more other computers or processors (not shown) used at the various stages, such as at the board assembly process 1054, and also incorporated into one or more other physical embodiments such as the mask 1032, the die 1036, the package 1040, the PCA 1058, other products such as prototype circuits or devices (not shown), or any combination thereof. Although various representative stages of production from a physical device design to a final product are depicted, in other embodiments fewer stages may be used or additional stages may be included. Similarly, the process 1000 may be performed by a single entity or by one or more entities performing various stages of the process 1000.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), a magnetoresistive random access memory (MRAM), a spin-torque-transfer magnetoresistive random access memory (STT-MRAM), flash memory, read-only memory (ROM), programmable read-only memory (PROM), erasable programmable read-only memory (EPROM), electrically erasable programmable read-only memory (EEPROM), registers, a hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A method comprising:
   detecting that a mobile device is charging;
   in response to detecting that the mobile device is charging, modifying a schedule for performance of a scheduled housekeeping operation at the mobile device and
   wherein the scheduled housekeeping operation comprises performing an error correction operation at a memory of the mobile device, performing a memory self-refresh operation at the memory of the mobile device, performing a transfer operation from volatile memory of the mobile device to non-volatile memory of the mobile device, or any combination thereof.

2. The method of claim 1, further comprising pausing the housekeeping operation in response to detecting that the mobile device is not charging.

3. The method of claim 2, further comprising resuming the housekeeping operation in response to detecting that the mobile device is charging after pausing the housekeeping operation.

4. The method of claim 1, further comprising executing the scheduled housekeeping operation when a housekeeping timer exceeds a threshold and the mobile device is not connected to a charger.

5. The method of claim 4, further comprising resetting the housekeeping timer in response to a completion of the housekeeping operation.

6. The method of claim 1, wherein modifying the scheduled housekeeping operation is performed at a processor integrated into the mobile device.

7. A method at a mobile device that executes housekeeping operations according to a schedule, the method comprising:
   detecting that the mobile device is charging; and in response to detecting that the mobile device is charging, initiating a housekeeping operation at the mobile device in accordance with a system-level policy of the mobile device, wherein the system-level policy comprises, when the mobile device is charging, initiating the housekeeping operation at a time other than a scheduled initiation time; and wherein the housekeeping operation comprises performing an error correction operation at a memory of the mobile device, performing a memory self-refresh operation at the memory of the mobile device, performing a transfer operation from volatile memory of the mobile device to non-volatile memory of the mobile device, or any combination thereof.

8. The method of claim 7, wherein the housekeeping operation is applied to a component within the mobile device, and wherein the system-level policy is controlled external to the component.

9. The method of claim 8, wherein the component comprises at least one of a system-on-a-chip or a memory.

10. The method of claim 7, wherein the system-level policy comprises initiating the housekeeping operation when the mobile device is not connected to a charger in response to determining that a housekeeping timer exceeds a threshold.

11. The method of claim 7, wherein the system-level policy is user programmable.

12. The method of claim 7, wherein the detection that the mobile device is charging and the initiation of the housekeeping operation are performed at a processor integrated into the mobile device.

13. A method comprising:
relaxing a physical design requirement of a component of a mobile device based on an adjustable system-level policy controlled external to the component, wherein the adjustable system-level policy controls performance of a housekeeping operation based on, at least in part, whether the mobile device is charging; and wherein the housekeeping operation comprises performing an error correction operation at a memory of the mobile device, performing a memory self-refresh operation at the memory of the mobile device, performing a transfer operation from volatile memory of the mobile device to non-volatile memory of the mobile device, or any combination thereof.

14. The method of claim 13, wherein the component comprises a memory, and further comprising:
selecting the adjustable system-level policy; and
wherein relaxing the design requirement comprises selecting a data retention characteristic of the component based on the adjustable system-level policy.

15. The method of claim 14, wherein selecting the data retention characteristic comprises reducing a retention capability of memory in the component in response to selecting in the adjustable system-level policy an increase in a refresh rate of the memory.

16. The method of claim 13, wherein relaxing the physical design requirement comprises reducing a write current for a data write operation at the component.

17. The method of claim 13, wherein the relaxing of the design requirement is performed at a processor integrated into the mobile device.

18. An apparatus comprising:
a component configured to execute a housekeeping operation at a mobile device according to a schedule; and
a power management integrated circuit configured to, when the component is operating according to the schedule, initiate the housekeeping operation at the component in response to detecting that the mobile device is charging and at a time other than a scheduled initiation time of the housekeeping operation; and wherein the housekeeping operation comprises performing an error correction operation at a memory of the mobile device, performing a memory self-refresh operation at the memory of the mobile device, performing a transfer operation from volatile memory of the mobile device to non-volatile memory of the mobile device, or any combination thereof.

19. The apparatus of claim 18, wherein the power management integrated circuit implements a system-level policy to control initiation of the housekeeping operation.

20. The apparatus of claim 18, wherein the power management integrated circuit is further configured to instruct the component to initiate the housekeeping operation in response to a housekeeping timer exceeding a threshold.

21. The apparatus of claim 18, wherein the component comprises a memory device.

22. The apparatus of claim 18, integrated in at least one semiconductor die.

23. The apparatus of claim 18, further comprising at least one of a set top box, a music player, a video player, an entertainment unit, a navigation device, a communications device, a personal digital assistant (PDA), or a computer, into which the apparatus is integrated.

24. An apparatus comprising:
means for executing a housekeeping operation at a mobile device according to a schedule;
means for initiating the housekeeping operation, when the means for executing the housekeeping operation is operating according to the schedule, in response to detecting that the mobile device is charging and at a time other than a scheduled initiation time of the housekeeping operation; and wherein the housekeeping operation comprises performing an error correction operation at a memory of the mobile device, performing a memory self-refresh operation at the memory of the mobile device, performing a transfer operation from volatile memory of the mobile device to non-volatile memory of the mobile device, or any combination thereof.

25. The apparatus of claim 24, integrated in at least one semiconductor die.

26. The apparatus of claim 24, further comprising at least one of: a set top box, a music player, a video player, an entertainment unit, a navigation device, a communications device, a personal digital assistant (PDA), or a computer, into which the apparatus is integrated.

27. A method comprising:
at a mobile device that executes housekeeping operations according to a schedule:
a first step for detecting that the mobile device is charging; and
a second step for, in response to detecting that the mobile device is charging, initiating a housekeeping operation at the mobile device in accordance with a system-level policy of the mobile device, wherein the system-level policy comprises, when the mobile device is charging, initiating the housekeeping operation at a time other than a scheduled initiation timer; and wherein the housekeeping operation comprises performing an error correction operation at a memory of the mobile device, performing a memory self-refresh operation at the memory of the mobile device, performing a transfer operation from volatile memory of the mobile device to non-volatile memory of the mobile device, or any combination thereof.

28. The method of claim 27, wherein the first step and the second step are performed by a processor integrated into the mobile device.

29. A computer-readable tangible medium storing instructions that, when executed by a processor of a mobile device that executes housekeeping operations according to a schedule, cause the processor to:
- detect that the mobile device is charging;
- in response to detecting that the mobile device is charging, initiate a housekeeping operation at the mobile device in accordance with a system-level policy of the mobile device, wherein the system-level policy comprises, when the mobile device is charging, initiating the housekeeping operation at a time other than a scheduled initiation time; and
- wherein the housekeeping operation comprises performing an error correction operation at a memory of the mobile device, performing a memory self-refresh operation at the memory of the mobile device, performing a transfer operation from volatile memory of the mobile device to non-volatile memory of the mobile device, or any combination thereof.

30. The computer-readable tangible medium of claim 29, wherein the instructions are executable by a processor integrated in at least one of a set top box, a music player, a video player, an entertainment unit, a navigation device, a communications device, a personal digital assistant (PDA), or a computer.

* * * * *